United States Patent
Pfefferl

[19]

[11] Patent Number: 6,138,214

[45] Date of Patent: *Oct. 24, 2000

[54] SYNCHRONOUS DYNAMIC RANDOM ACCESS MEMORY ARCHITECTURE FOR SEQUENTIAL BURST MODE

[75] Inventor: Karl Peter Pfefferl, Hohenkirchen, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/994,829

[22] Filed: Dec. 19, 1997

[51] Int. Cl.$^7$ .................................................. G06F 12/00
[52] U.S. Cl. ........................... 711/137; 711/127; 711/157
[58] Field of Search ..................... 711/105, 118, 711/157, 127, 137

[56] References Cited

U.S. PATENT DOCUMENTS

| | | | |
|---|---|---|---|
| 5,285,421 | 2/1994 | Young et al. | 365/230.04 |
| 5,386,540 | 1/1995 | Young et al. | 395/425 |
| 5,392,239 | 2/1995 | Margulis et al. | 365/189.01 |
| 5,416,749 | 5/1995 | Lai | 365/240 |
| 5,453,957 | 9/1995 | Norris et al. | 365/230.04 |
| 5,539,696 | 7/1996 | Patel | 365/189 |
| 5,781,918 | 7/1998 | Lieberman et al. | 711/5 |
| 5,829,026 | 10/1998 | Leung et al. | 711/122 |
| 5,848,428 | 12/1998 | Collins | 711/127 |
| 5,924,111 | 7/1999 | Huang et al. | 711/5 |

FOREIGN PATENT DOCUMENTS

| | | |
|---|---|---|
| 0 447 051 A2 | 9/1991 | European Pat. Off. . |
| 196 28 039 A1 | 7/1997 | Germany . |

OTHER PUBLICATIONS

"A 150–Mhz 4–Bank 64M–bit SDRAM with Address Incrementing Pipeline Scheme," Yukinori Kodama et al., 1994 Symposium on VLSI Circuits Digest of Technical Papers, 1994 IEEE, pp. 81–82.

"16Mbit Synchronous DRAM with 125Mbyte/sec Data Rate," Yunho Choi et al., pp. 65–66.

*Primary Examiner*—John W. Cabeca
*Assistant Examiner*—Brian R. Peugh
*Attorney, Agent, or Firm*—Stanton C. Braden

[57] ABSTRACT

An electronic memory device which includes a memory array having a plurality of memory cells arranged into a plurality of units. Each unit is divided into a first portion including only even addressed memory cells and a second portion including only odd addressed memory cells. A column decoder and row decoder are coupled to the memory array for selecting a number of the plurality of memory cells. A sense amplifier is coupled to the memory array for performing read and write operations from the selected memory cells. An address line is split for application of a split address to said even and odd addressed memory cells.

8 Claims, 4 Drawing Sheets

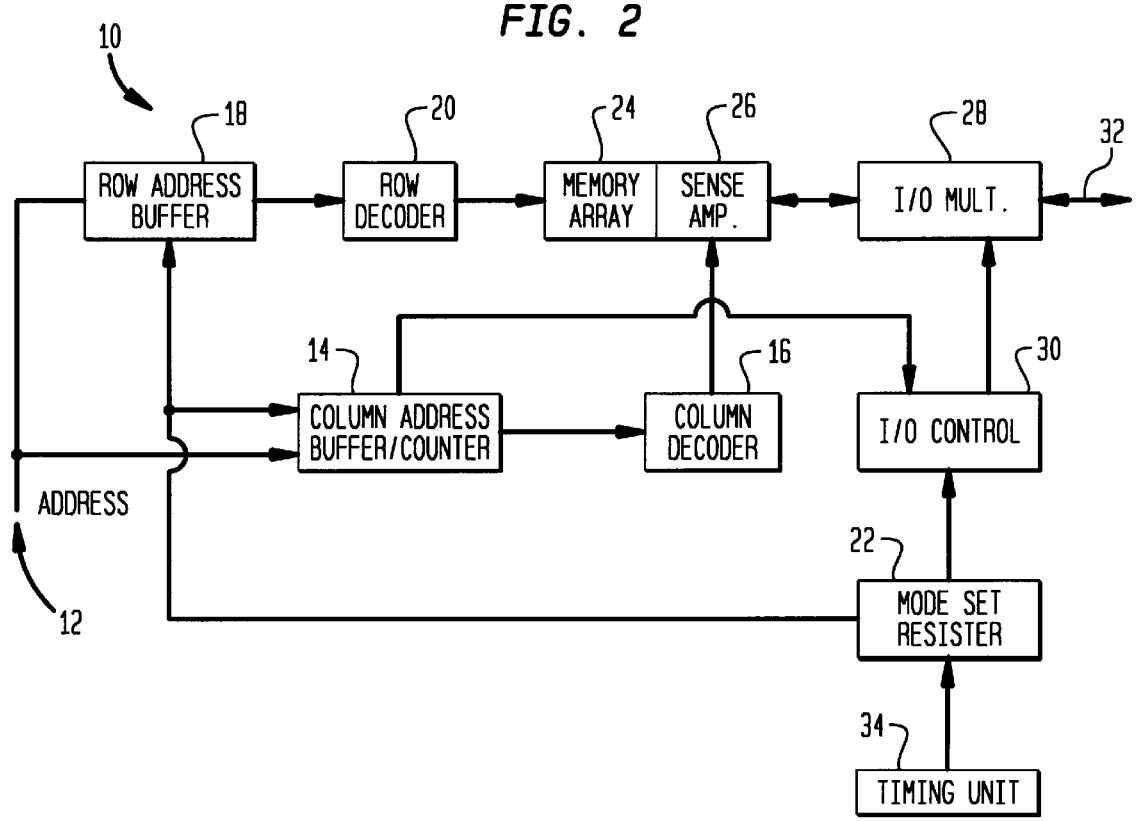

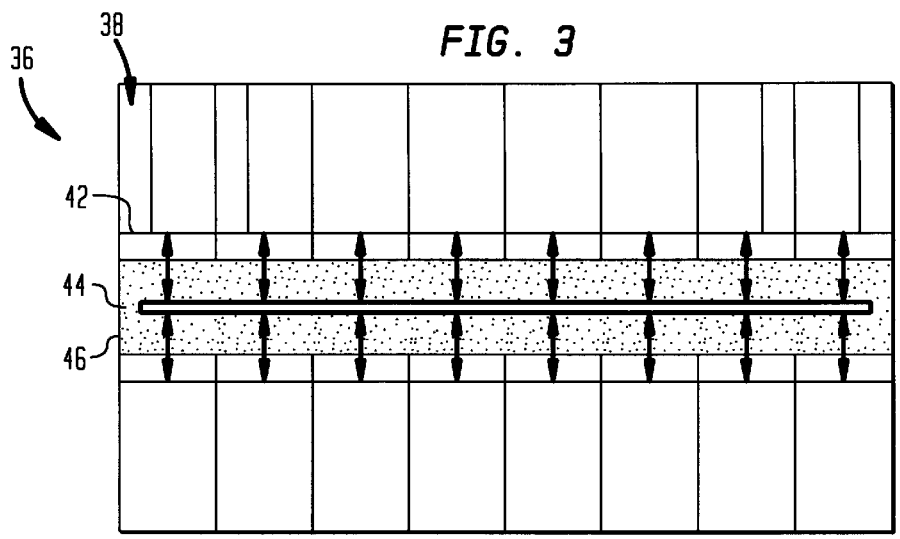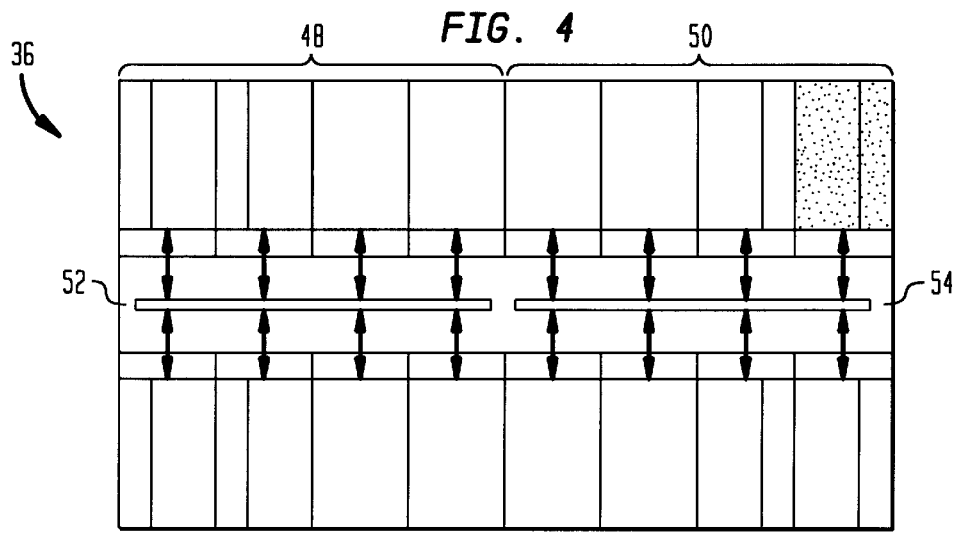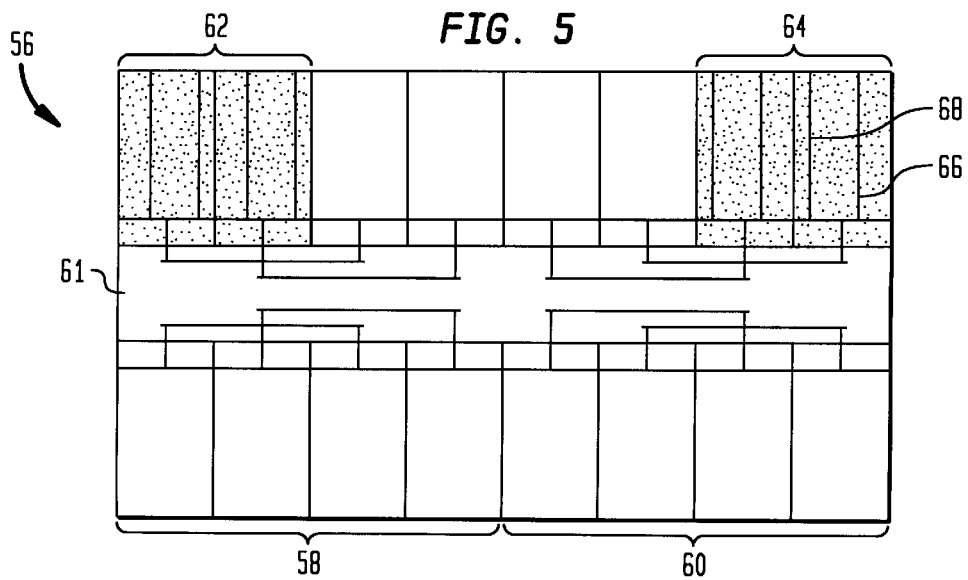

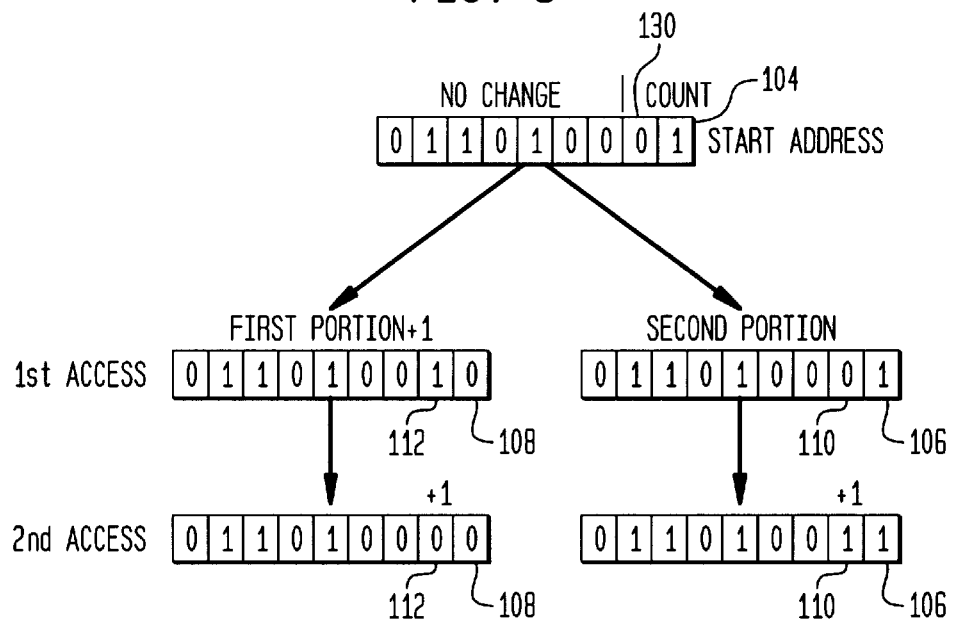
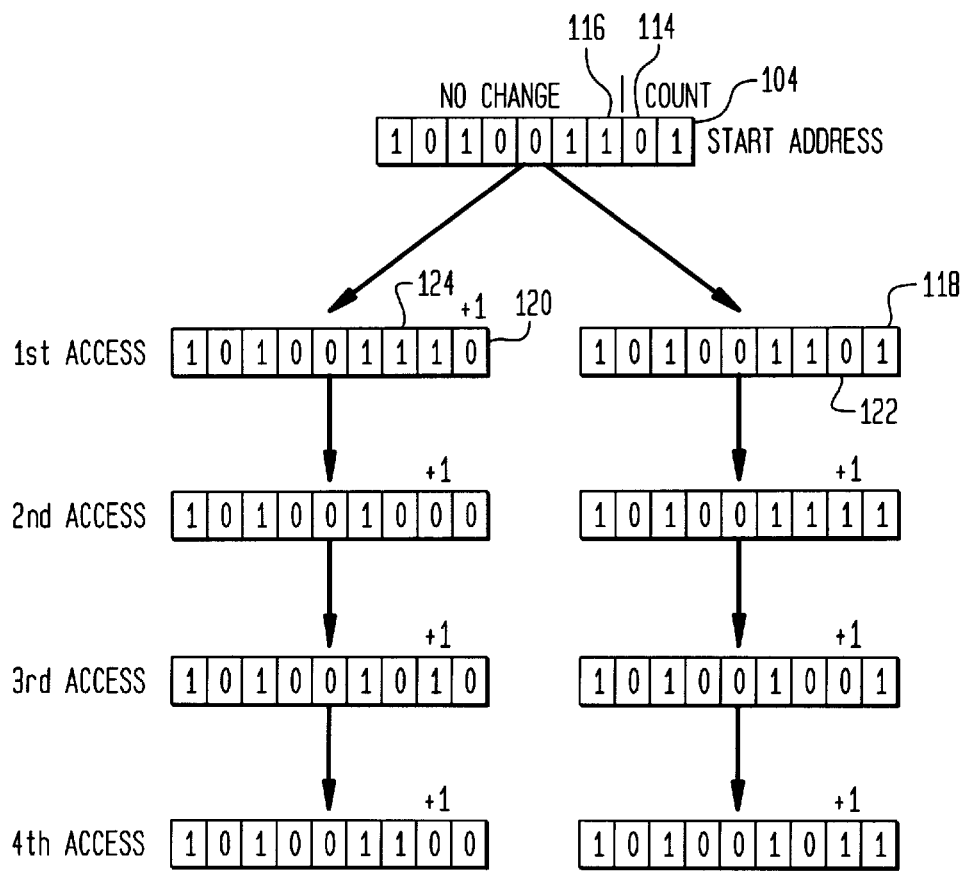

SYNCHRONOUS DYNAMIC RANDOM ACCESS MEMORY ARCHITECTURE FOR SEQUENTIAL BURST MODE

BACKGROUND OF THE INVENTION

1. Field of the Invention

The present invention relates generally to an electronic memory device and more particularly, to a Synchronous Dynamic Random Access Memory having an improved architecture for operating in the burst mode without substantially increasing the size of the Memory.

2. Description of the Prior Art

Dynamic Random Access Memory (DRAM) is utilized in various electronic systems for storing large amounts of digitally encoded information. The speed of DRAMs have become more critical since the electronic systems that utilize these devices are operating at ever increasing speeds. This requires DRAM devices that have much faster access times for both reading and writing functions.

A number of techniques have been developed to increase the performance of these devices. One such technique is known as "pre-fetching", which is disclosed in U.S. Pat. No. 5,285,421, entitled SCHEME FOR ELIMINATING PAGE BOUNDARY LIMITATION ON INITIAL ACCESS OF A SERIAL CONTIGUOUS ACCESS MEMORY, issued on Feb. 8, 1994. The "pre-fetching" technique is usually utilized in a special type of DRAM known as a Sequential Dynamic Random Access Memory (SDRAM). In these types of devices, successive memory locations are accessed which are often adjacently located.

The "pre-fetching" technique takes advantage of the sequential access pattern by latching additional data into a register, in addition to the data corresponding to the specified address. The additional data is located in addresses adjacent to the specified address. By storing the additional data fetched in the register, subsequent data may be made available in the time it requires to read the register, which is shorter than the initial access time. Thus, the total time for completing a number of sequential accesses is significantly reduced.

Another technique known as "burst mode" is disclosed in U.S. Pat. No. 5,392,239 to Margulis et al., entitled BURST MODE DRAM, issued on Feb. 21, 1995. This technique involves a large block of data to be either rapidly read or written to a group of consecutive addresses. The use of consecutive addresses increases DRAM performance because the addressing scheme can be simplified. This technique only requires a single initial address to be specified in which additional addresses can be generated by incrementing the initial address. Thus, it is no longer required to send an entire address with every word of data. Margulis implements the burst mode technique by utilizing a burst mode detector, counter and buffer.

SDRAM devices and other types of memory devices are requiring faster access times. The clock frequency of, for example, a 256M SDRAM is expected to be between 200 MHz and 250 MHz. In order to realize such a device, a 2 bit pre-fetch is usually required. These clock speeds also require the data to be transferred to and from the device utilizing the "burst mode" technique, where there is one data transfer per clock cycle (4–5 ns). The burst length or number of clock cycles is usually determined by a SDRAM Mode Register.

In SDRAM devices, there are two different burst types, which are determined by the SDRAM Mode Register as well. One burst type is the sequential mode, while the other type is the interleaved mode. FIG. 1 is a table which demonstrates the differences between the two different burst modes having a burst length of 4. As is shown, the burst type determines the order of how the data is accessed dependent on the starting address. In the sequential mode the data is accessed in consecutive addresses, while in the interleaved mode only the higher or lower addresses are accessed first.

Implementing either burst type in a large SDRAM device such as a 256M chip, can be difficult and costly. This is because such devices require a very large architecture to support such a device.

It is therefore, an object of the present invention to provide an improved architecture that enables a SDRAM device to operate in the sequential burst mode without substantially increasing the size of the device.

SUMMARY OF THE INVENTION

An electronic memory device, comprising a memory array having a plurality of memory cells arranged into a plurality of units, wherein each unit is divided into a first portion having even addressed memory cells and a second portion having odd addressed memory cells, a column decoder and row decoder coupled to said memory array for selecting a number of said plurality of memory cells, a sense amplifier coupled to said memory array for performing read and write operations from said selected memory cells, and a plurality of address bits coupled to said column decoder via a plurality of address lines, at least one of said address bits being split into two split bits for application via split address lines onto said even and odd addressed memory cells, wherein during memory access, said split bits are incremented by one for each access in a burst mode.

BRIEF DESCRIPTION OF THE DRAWING

The above objects, further features and advantages of the present invention are described in detail below in conjunction with the drawings, of which:

FIG. 1 is a table that depicts the addressing order for the sequential and interleaved burst types;

FIG. 2 is a block diagram of the circuitry to support the SDRAM architecture according to the present invention;

FIG. 3 is one possible address path for a DRAM device;

FIG. 4 is one possible data path for a DRAM device;

FIG. 5 is diagram of the SDRAM architecture according to the present invention;

FIG. 8 is a table of the addressing scheme in the sequential burst mode for the SDRAM device having a burst length of four according to the present invention; and FIG. 9 is a table of the addressing scheme in the sequential burst mode for the SDRAM device having a burst length of eight according to the present invention.

DETAILED DESCRIPTION OF THE DRAWING

Figure 6:
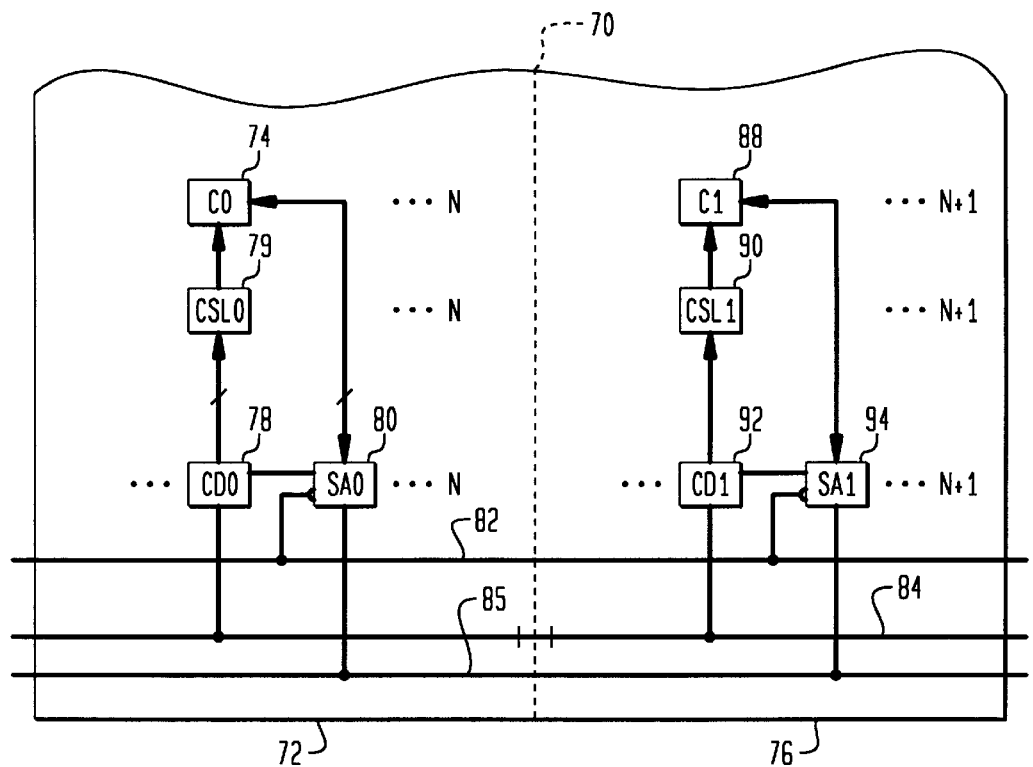
FIG. 6 is a diagram of the unit architecture in the interleaved burst mode for the SDRAM device according to the present invention.

The present invention is directed to an improved architecture for a memory device. Such memory devices include, for example, DRAMs, SDRAMs, other types of high speed DRAMs, or other memory devices. In accordance with the invention, the architecture enables a two bit pre-fetch to be utilized in either the interleaved burst mode or sequential burst mode without substantially increasing the size of the device. However, before discussing the details of the present invention, a block diagram of the circuitry capable of supporting this improved architecture and other DRAM architectures will be discussed.

Referring to FIG. 2, there is shown a block diagram of the circuitry to support the improved memory architecture according to the present invention. The circuitry 10 includes a terminal 12 to receive an address for selecting a particular memory location of a memory array 24. The address consists of two parts including a row address portion and a column address portion. The column address portion is received by the column address buffer/counter 14, while the row address portion is received by the row address buffer 18.

The column address buffer/counter 14 is utilized to store and increment the column address portion, while the row address buffer is utilized to just store the row address portion. The column address portion is incremented in order to enable the "burst mode" technique to be utilized in the present invention. As previously described, the "burst mode" technique is an improved method for transmitting address information to a memory device because only one address has to be transmitted for every burst length of addresses to be accessed. For example, a burst length of four would require the column address buffer/counter 14 to increment the column address portion three times in order to access four memory locations per burst cycle.

The column address buffer/counter 14 is capable of operating in the interleaved as well as in the sequential burst mode as described in the prior art section. Coupled to the column address buffer/counter 14 is a mode set register 22, which provides the control signals for switching the address buffer/counter 14 between either burst modes. When in the interleaved mode, the address buffer/counter 14 increments the column address portion according to the third column of FIG. 1. While in the sequential mode, the address buffer/counter 14 increments the column address portion according to the second column of FIG. 1. It should be noted that the present invention being discussed in regard to a burst length of four is meant as an example only. The present invention can be configured to operate with a higher burst length such as eight or even a full page.

The row address buffer 18 is coupled to a row decoder 20, while the column address counter/buffer 14 is coupled to a column decoder 16. The decoders 16,20 receive the addresses stored by the column address/buffer 14 and row address buffer 18 in order to access a particular memory location in the memory array 24. Both decoders 16,20 are coupled to the memory array 24 directly or through sense amplifier 26 to perform this function. In particular, the column decoder 16 is coupled to a plurality of column select lines located in the memory array which will be described further later. The memory array 24 consists of a large number of memory cells arranged in a predetermined order, which will be described in detail later. In the present invention, these cells are preferably DRAM cells. Coupled to the memory array 24 is also a sense amplifier 26 which performs the read and write operations when a particular memory cell is accessed.

Coupled to the sense amplifier 26 is an I/O multiplexer 28 which is utilized to support the pre-fetching operation of the present invention. As previously discussed, high speed DRAM devices such as the present invention require at least a two bit pre-fetch to be utilized. Pre-fetching improves the performance of these devices because data for adjacent memory locations is transferred in blocks to and from the memory array 24. In the case of a two bit pre-fetch, data for two adjacent locations are transferred at a time. The I/O multiplexer 28 contains latches utilized to gate the pre-fetch data for the read and write cycles. The pre-fetch data is retrievable at an I/O terminal 32.

Coupled to the I/O multiplexer 28 is an I/O control 30, which provides the timing and control signals for the pre-fetch operation. The timing for the entire SDRAM device circuitry is supplied by the timing unit 34. The timing unit 34 preferably has a clock frequency between 200 to 250 MHz.

Referring to FIG. 3, one possible address path for a DRAM device is shown. This DRAM device 36 includes a 256M memory array which is sub-divided into sixteen individual units. Each unit 38 is arranged to include 512 columns which are individually selected by the 512 Column Select Lines (CSL). The 512 CSLs are coupled to a column decoder 42 which as previously discussed select the column in the memory array based on the column address portion it receives. Each CSL 40 when selected transfers eight data bits per unit. Up to four units are selected in order to transfer 32 bits per device. The column decoders 42 and the appropriate addresses 44 are placed near the center of the device known as a spine 46 in order to minimize the address wire length. Such a configuration reduces the power consumed for addressing purposes and increases the speed of the device 36.

Referring to FIG. 4, there is shown a possible data path for the same DRAM device 36 as disclosed in FIG. 3. An important improvement in this particular device 36 is that it is divided into two parts for data purposes including a left side 48 and a right side 50. This enables data connections to be separated between the left eight units 48 and the left sixteen I/O pads 52. Similarly data connections are made separately between the right eight units 50 and the right sixteen I/O pads 54. This configuration results in a reduced power consumption and size and also increases the speed of the device because the wiring for the data is also shortened.

Referring to FIG. 5, a diagram of the SDRAM architecture according to the present invention is shown. This device 56 preferably includes many of the features described in regard to FIGS. 3 and 4. Thus, this device preferably includes a memory array divided into sixteen individual units arranged into a left side 58 and right side 60. Each unit preferably includes 512 columns which are capable of being individually addressed by 512 CSLs. The wiring for addressing purposes is also placed in the spine portion of the device 61.

An additional feature of this device 56 includes further sub-dividing the memory array of the present invention into four banks. This configuration is realized by utilizing four units for each bank. Each bank preferably is configured to include two units from the left side 62 and another two units from the right side of the device 64.

In the present invention, it is preferred that each memory array bank 62,64 is separately accessed per each burst length of addresses. For example, a burst length of four requires four separate memory locations to be accessed in a particular memory bank 62,64 before the next memory bank is accessed. Also, it is preferred that for each separate burst address, all four units of the memory bank 62,64 are accessed. Thus, by selecting one CSL per unit 66 each bank 62,64 is preferably configured to supply a computer word having a length of 32 bits, producing a 64 data bit word.

The device 56 of the present invention preferably utilizes a two bit pre-fetch. This is preferably accomplished by selecting two CSLs 66,68 per unit of each memory bank.

Referring to FIG. 6, there is shown a diagram of the unit architecture in the interleaved burst mode for the SDRAM device according to the present invention. This particular architecture preferably includes 512 column addresses in each unit. Each unit 70 is divided into a first portion and second portion, wherein a first portion 72 includes evenly addressed memory locations and a second portion 76 includes odd addressed memory locations. Coupled to columns 74 and 88 are corresponding CSLs 79 and 90 and sense amplifiers 80 and 94. CSL 79 and 90 are correspondingly coupled to column decoders 78 and 92.

Coupled to each of the column decoders 78 and 92 is an address line 84. The address line 84 preferably has a bit length of eight bits. It is utilized to simultaneous activate a column decoder in each of the unit portions 72 and 76, which along with a row decoder selects a corresponding pair of odd and even addresses in each unit 70. This will provide the 64 bits required for the two bit pre-fetch as previously described. Coupled to each of the sense amplifiers 80, 94 is a data line 85 and a fetch line 82. The data line 85 is preferably eight bits wide and is utilized to transport the data. The fetch line 82 is preferably one bit wide and is utilized to provide the timing signals which determines when data from each of the selected pair of addresses is gated to the data line 85 through the corresponding sense amplifiers 80, 94. This is because the data line 85 is only configured to transport data from a single address at a time.

During operation, an address is sent over the address line 84, which is received by first portion 72 and second portion 76 of unit 70 simultaneously. This activates one of the even column decoders 78 and one of the odd column decoders 92 in each unit 70. In FIG. 6, the even and odd column decoders 78, 92 are shown numbered in increasing consecutive order from left to right. However, such a configuration is not necessary. All that is required, is that any particular address from the address line 84 activates a unique pair of column decoders, which in turn selects a unique pair of even and odd columns having adjacently ordered addresses.

The above sequence, along with activating the row decoders, selects an even and odd address in each unit 70 to provide the two computer words. The even and odd addresses selected are numbered in the interleaved burst mode as previously discussed.

The data contained in the selected even and odd addresses are then sent over the data line 85 at the appropriate time. This is accomplished by sending the appropriate signal over the fetch line 82 to the corresponding sense amplifiers in each unit 70.

Implementing the sequential burst mode along with a two bit pre-fetch is more difficult than implementing the interleaved burst mode as previously described in regard to FIG. 6. The difficulty arises when an odd address is utilized to access the first burst data, outputting the second eight bits of the first sixteen bit line. The second burst data outputs the first eight bits of the second sixteen bit line. According to the illustrative embodiment of the present invention, this problem is solved by splitting one or more address bits.

Figure 7:
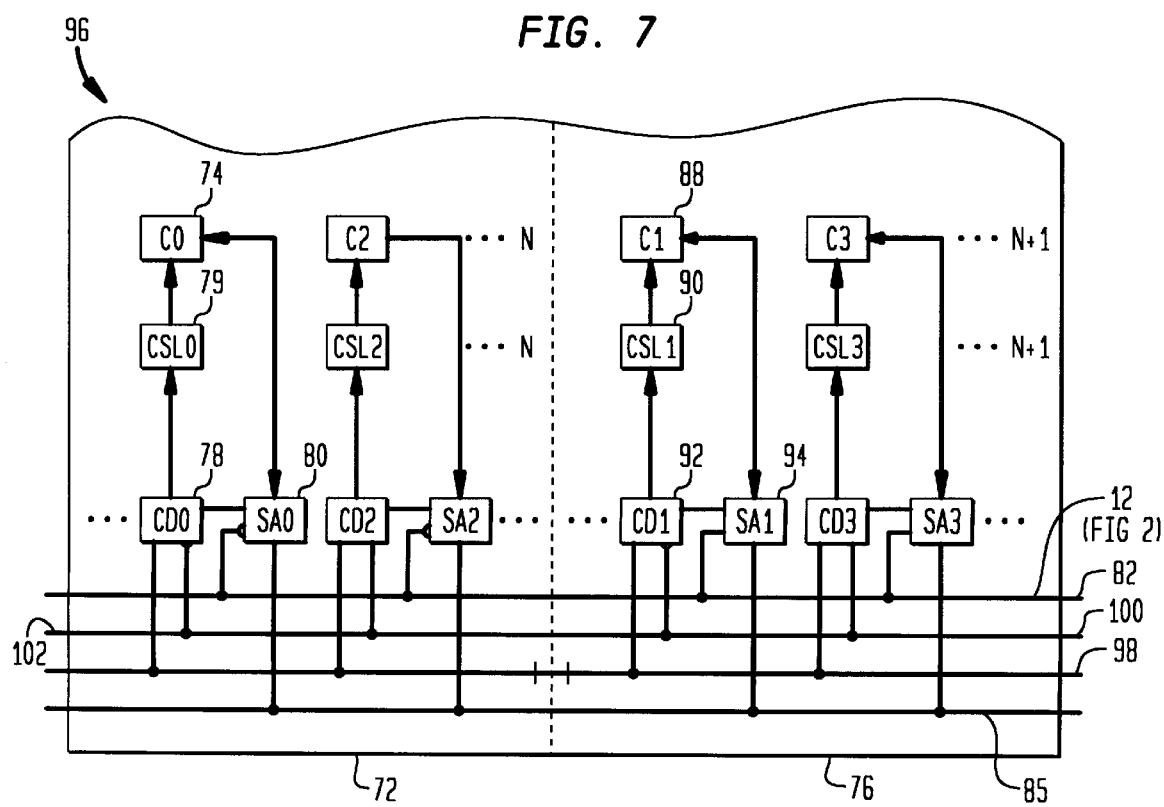
FIG. 7 is a diagram of the unit architecture in the sequential burst mode for the SDRAM device according to the present invention.

FIG. 7 illustrates the unit architecture in the sequential burst mode for the SDRAM device according to the present invention. This architecture 96 is similar to the architecture of FIG. 6, except for the addressing scheme of the column decoders which includes splitting the least significant address bit (if the count bit is included as address, the next least significant address bit) applied to each unit 96. FIG. 7 shows the configuration for a burst length of four.

As shown, 9 bits representing address (8 address bits and 1 count bit) and 8 data bits are present. Line 82 is the least significant or the count bit of the 9 bit address. Lines 100 and 102 represent the split bit, which is split for the next least significant bit of the 9 address bits. Line 98 represents the 7 remaining more significant bits of the 9 bit address. Line 85 represents the 8-bit data lines.

The operation of the unit architecture in the sequential burst mode operates the same as the interleaved mode except for the above described different addressing scheme. This portion of the operation is described with reference to FIG. 8, which is a table illustrating the addressing scheme for the unit architecture in the sequential burst mode having a burst length of four. The table of FIG. 8 includes a left column corresponding to the addresses applied to the left portion 72 of the unit architecture 96 and a right column corresponding to the addresses applied to the right portion 76 of the unit architecture 96. Since the present invention incorporates a two bit pre-fetch, the memory array of the device is accessed twice for a burst length of four, which is represented by the two rows in the table of FIG. 8.

During operation, a start address is applied to each of the units as shown in FIG. 8. Since this discussion assumes a burst length of four, only the next least significant bit 130 of the start address is required to be split. The next least significant bit 130 is split by applying it separately to the first and second portions 72 and 76 of the unit architecture 96. The least significant bit 104 applied to the first portion 108 is incremented by one, while the next to the least significant bit 130 applied to the first portion 112 is incremented when there is a carryover for the increment of the least significant bit 104. The seven more significant address bits (applied to line 98 of FIG. 7) remain unchanged. The second portion is identical to the start address. These addresses, as applied to the unit architecture, causes a sequentially numbered odd and even address to be selected which provides the two computer words necessary for the first two bit pre-fetch operation.

After the first two bit pre-fetch is accomplished, the addresses of the first access are incremented in order to perform the second access. This is accomplished by incrementing the second or next least significant bits 112 and 110 of first access which is accomplished by the address buffer/counter 14 described in FIG. 2. Still referring to FIG. 8, incrementing the addresses cause another sequentially numbered even and odd address to be selected, providing the two computer words necessary for the second two bit pre-fetch operation. In the second access of the SDRAM device according to the present invention, the least significant bits 106 and 108 do not change. Thus, the least significant bits remain unchanged from the first access.

The above described addressing scheme of the present invention can be generalized for any burst length. First of all, as previously discussed the length of the burst length determines the number of bit (s) that are required to be split. The number of bits required to be split (SB) is equal to one less than the power of two the burst length can be raised to, which is expressed by the following relationship:

$$SB = \frac{\log \text{Burst Length}}{\log 2} - 1 \qquad (1)$$

Utilizing Equation 1 for a burst length of eight, two bits are split. While for a full page or a burst length of 512, eight bits are split. Regardless of the burst length, the bits that are split are applied separately to each portion of the unit architecture, wherein the least significant bits applied to the first or left portion are incremented by one and the bits applied to the second or right portion are unchanged from the starting address.

The above described generalizations are illustrated by FIG. 9, which is a table of the addressing scheme for the unit architecture in the sequential burst mode having a burst length of eight. Because a burst length of eight is assumed, the next two of the least significant bits 114, 116 are split. As can be seen, the count bit applied to the first portion 120 is incremented by one, while the start address remains unchanged as applied to the second portion 118, 122. Also, the addresses from the first access are incremented for each subsequent pre-fetch operation by continually incrementing the second least significant bit by one.

While the invention has been particularly shown and described with reference to preferred embodiments thereof, it will be understood by those skilled in the art that changes in form and details may be made therein without departing from the spirit and scope of the present invention.

What is claimed is:

1. A memory device comprising:
  a memory array having a plurality of memory cells arranged into a plurality of units, wherein the units are divided into a first portion having even addressed memory cells and a second portion having odd addressed memory cells;
  a column decoder and row decoder coupled to said memory array for selecting a number of said plurality of memory cells;
  a sense amplifier coupled to said memory array for performing read and write operations from said selected memory cells; and
  a plurality of address lines coupled to said column decoder, at least one of said address lines being split into two split address lines onto said even and odd addressed memory cells, wherein during memory access in a pre-fetch mode, said split address lines are incremented for a subsequent sequential access in a burst mode, wherein the number of address lines to be split is determined by taking one less than the power of two a burst length value is raised to, wherein said burst length value is equal to the number of memory cells accessed for a given burst length of addresses of said device.

2. The device of claim 1, wherein said at least one of said address lines is the second least significant bit of a 9 bit address for a burst length of four.

3. The device according to claim 1, which further includes an address line for providing an address to said decoders that simultaneously selects an even addressed memory location and an odd addressed memory location in each of said plurality of units for a given access cycle of said memory array.

4. The device according to claim 1, wherein said plurality of memory cells is a plurality of DRAM cells.

5. The device according to claim 1, wherein said memory array is divided into two parts, wherein each said part includes eight units which are separately coupled to I/O Pads.

6. A method for addressing a memory device including a memory array having a plurality of memory cells arranged into a plurality of units, wherein each unit is divided into a first portion including only even addressed memory cells and a second portion including only odd addressed memory cells, said method comprising the steps of:
  providing an initial start address;
  selecting a predetermined number of least significant bits of said start address;
  generating a modified address by incrementing by one said selected predetermined number of least significant bits;
  applying said modified address to said first portion of each unit and said start address to said second portion of each unit in order to simultaneously select an even addressed memory location and an odd addressed memory location in each said unit for a pre-fetch access cycle of said memory array; and
  incrementing by one said selected predetermined number of least significant bits for each sequential access in a burst mode, wherein said selected predetermined number of least significant bits (SB) is calculated by the following formula:

$$SB = \frac{\log \text{Burst Length}}{\log 2} - 1,$$

wherein the Burst Length is equal to the number of memory cells accessed for a given burst length of addresses of the electronic memory device.

7. The method of claim 6, wherein said selected number of least significant bits of said start address is applied to said first portion and said second portion of said unit over a split address line.

8. A memory device comprising:
  a memory array having a plurality of memory cells arranged into a plurality of units, wherein the units are divided into a first portion having even addressed memory cells and a second portion having odd addressed memory cells;
  a column decoder and row decoder coupled to said memory array for selecting a number of said plurality of memory cells,
  a sense amplifier coupled to said memory array for performing red and write operations from said selected memory cells; and
  a plurality of address lines coupled to the column decoder, at least one of said address lines being split into two split address lines onto said even and odd addressed memory cells, wherein during memory access, said split address lines are incremented for a subsequent sequential access in a burst mode, wherein said at least one of said address lines is applied to the second least significant bit of a 9 bit address for a burst length of four.

* * * * *